United States Patent
Straub, Jr. et al.

(10) Patent No.: US 7,180,737 B2
(45) Date of Patent: Feb. 20, 2007

(54) HEAT EXCHANGER SYSTEM FOR CIRCUIT CARD ASSEMBLIES

(75) Inventors: Walter H. Straub, Jr., Palm Bay, FL (US); Jonathan Frank Holmes, Palm Bay, FL (US); Voi V. Nguyen, Oviedo, FL (US)

(73) Assignee: Harris Corporation, Melbourne, FL (US)

( * ) Notice: Subject to any disclaimer, the term of this patent is extended or adjusted under 35 U.S.C. 154(b) by 277 days.

(21) Appl. No.: 11/017,333

(22) Filed: Dec. 20, 2004

(65) Prior Publication Data
US 2006/0133033 A1   Jun. 22, 2006

(51) Int. Cl.
*H05K 7/20* (2006.01)
(52) U.S. Cl. ............ 361/690; 361/692; 361/695; 361/716; 361/721; 174/16.1; 165/80.1; 165/80.3; 165/122; 454/184
(58) Field of Classification Search ............ None
See application file for complete search history.

(56) References Cited

U.S. PATENT DOCUMENTS

| | | | | |
|---|---|---|---|---|
| 4,851,965 A | * | 7/1989 | Gabuzda et al. ............ 361/691 |
| 5,063,476 A | * | 11/1991 | Hamadah et al. ............ 361/697 |
| 5,361,188 A | * | 11/1994 | Kondou et al. ............ 361/695 |
| 5,835,349 A | | 11/1998 | Giannatto et al. ............ 361/701 |
| 5,940,266 A | * | 8/1999 | Hamilton et al. ............ 361/695 |
| 6,084,771 A | * | 7/2000 | Ranchy et al. ............ 361/699 |
| 6,493,224 B1 | * | 12/2002 | Mottahed ............ 361/692 |
| 6,522,540 B2 | * | 2/2003 | Sakaiya et al. ............ 361/697 |
| 6,621,713 B2 | * | 9/2003 | Amaike et al. ............ 361/797 |
| 6,661,657 B1 | * | 12/2003 | Banton et al. ............ 361/690 |

* cited by examiner

*Primary Examiner*—Boris Chervinsky
(74) *Attorney, Agent, or Firm*—Gray Robinson, P.A.

(57) ABSTRACT

An apparatus for housing and cooling circuit card assemblies employed in communication and other systems is disclosed including a chassis having opposed end walls which are formed with a series of spaced inlet card guides and correspondingly spaced outlet card guides, respectively. A straight-pass heat exchanger is directly mounted to each circuit card assembly via thermally conductive material, and opposed ends of the heat exchanger are mounted by a wedge lock to respective inlet and outlet card guides. The heat exchanger employs unique angled interface geometry that creates a gasketless airtight joint with complimentary inlet and outlet card guide geometry through which cooling air passes.

25 Claims, 5 Drawing Sheets

HEAT EXCHANGER SYSTEM FOR CIRCUIT CARD ASSEMBLIES

FIELD OF THE INVENTION

This invention is directed to an apparatus for mounting and cooling circuit card assemblies, and, more particularly, to a chassis including a number of self-sealing, straight-pass heat exchangers each directly mounted to a circuit card assembly forming a number of modules which are individually secured by wedge locks to an inlet card guide and an outlet card guide formed on opposed end walls of the chassis.

BACKGROUND OF THE INVENTION

Many communications systems, especially those intended for use in mobile platforms, must be environmentally robust both in terms of their hardware and signaling format. Airborne communication systems used with a plurality of UHF line-of-sight and satellite links, for example, may incorporate a transceiver mounting chassis or enclosure containing diverse communication equipment such as RF transmitter modules, RF receiver modules and various digital signal processing modules which control operation of the RF components and interface digital communications signals with attendant encryption and decryption circuits. Considering that each communication link has its own dedicated signaling scheme, suppliers of this equipment typically provide each system as an integrated unit.

One of the standard architectures employed by suppliers of such systems is the Versa Module Europa or VME bus. RF signaling circuits and digital signaling modules plug into discrete connector slots on the VME bus to avoid cross-talk and provide isolation between such components, and, to conform with the relatively tight dimensional spacing between the connector slots on the VME bus. Whether the communication system is intended for use in a mobile platform as noted above, or other applications, the enclosure or chassis which houses the VME bus and communication equipment components must be designed to withstand harsh environmental conditions including vibration, temperature variations and exposure to foreign matter. Consequently, VME bus specifications mandate ruggedized housing architectures which have the ability to cool circuit components and protect them from exposure to excess vibration and foreign material.

Initial efforts to meet VME bus specifications included chassis designs incorporating expensive and complex heat transfer elements. Alternatively, or in addition to these measures, the circuit card assemblies were provided with special, thermally robust circuit elements which added cost and unwanted bulk to the design.

These deficiencies were addressed to some extent in the system disclosed in U.S. Pat. No. 5,835,349 to Giannatto et al. This patent discloses a housing and cooling assembly which reduces the cost and overall size of the unit, while providing effective cooling of circuit components on the circuit card assemblies. A "U-pass" heat exchanger is mounted directly to each individual circuit card assembly which imparts structural rigidity to the cards, and isolates the circuit cards from the flow of cooling fluid, e.g. air, passing through the heat exchanger in a U-shaped flow path to and from an inlet/exhaust plenum. The circuit card assembly of each circuit card/heat exchanger combination or module is plugged into the VME bus, while the inlet and outlet of the heat exchanger is sealed with a gasket to elements of the chassis.

While the system of the U.S. Pat. No. 5,835,349 patent provides a number of advantages over prior approaches, it nevertheless has some limitations. Cooling air from outside of the heat exchanger circulates from the inlet of the plenum to the opposite end of the heat exchanger, and then reverses direction in order to flow to the exhaust portion of the same plenum. This U-shaped flow path creates a relatively large pressure drop that reduces the heat transfer performance of the heat exchanger. Additionally, the use of a gasket to seal the inlet and outlet of the heat exchanger reduces the reliability of the system, and creates a maintenance issue since the gaskets can be easily damaged and may require periodic replacement. Further, the circuit card/heat exchanger modules are provided with rails at each end which engage opposed slots formed in the end walls of the chassis to mount them in place. In order to readily permit installation of the modules in the chassis, the mating rails and slots cannot be constructed with tolerances which are too tight, and therefore the overall rigidity of the assembly is sacrificed to some extent and tolerance to vibration is reduced.

SUMMARY OF THE INVENTION

This invention is directed to an apparatus for housing and cooling circuit card assemblies employed in communication and other electronic systems. The apparatus includes a housing or chassis having opposed end walls, which are formed with a series of spaced inlet card guides and correspondingly spaced outlet card guides, respectively. A straight-pass heat exchanger is directly mounted to each circuit card assembly, and opposed ends of the heat exchanger are mounted by a wedge lock to respective inlet and outlet card guides.

One important aspect of this invention is the construction and mounting of the straight-pass heat exchangers. A significant amount of heat is produced by the circuit elements on each circuit card assembly which needs to be removed in order for them to operate properly. It is desired to employ standard VME bus architectures with commercial off-the-shelf (COTS) components to reduce cost and simplify construction. The heat exchanger of this invention is directly mounted to one side of each circuit card assembly to enhance the transfer of heat away from the circuit elements to the heat exchanger. In the presently preferred embodiment, the heat exchanger includes a section of corrugated fin stock mounted within a frame between an outer skin and a thermal interface sheet connected to the circuit card assembly. A flow of outside air is directed in essentially a straight path through the heat exchanger, from its inlet end mounted to the inlet card guide of the housing chassis, across the corrugated fin stock, to its outlet end mounted to the outlet card guide of the housing. Further, the air flowing through the inlet and outlet card guides is transmitted along nearly a straight flow path. Consequently, a minimal pressure drop is produced in the course of passage of cooling air through the chassis and heat exchanger, and a highly efficient transfer of heat away from the circuit card assemblies is provided.

Another advantage of this invention relates to the manner in which the interconnected heat exchangers and circuit card assemblies, or modules, are mounted within the housing or chassis. In the presently preferred embodiment, each of the inlet and outlet card guides has an angled surface which is formed to engage angled V-groove surfaces machined into the ends of the heat exchanger frame of each module. Wedge locks are coupled to the ends of the heat exchanger frame opposite the angled card guide surfaces. When each wedge lock is operated, the angled V-grooves of the heat exchanger frame are urged against the angled surfaces of respective card guides to securely mount the entire module within the housing. This forms a gasketless, air-tight interface between the heat exchanger and the inlet and outlet card guides, through which cooling air can flow.

The mounting arrangement described above has a number of advantages. The angled interface between the ends of the heat exchanger frame and the card guides is self-sealing which eliminates the need for gaskets, and thus greatly reduces ongoing maintenance of the unit. Such angled interface maximizes the module sealing area, maximizes rotational stiffness at the module-housing interface and minimizes the pitch of the module within the housing unit. The use of wedge locks to secure the modules within the chassis rigidifies the entire structure which greatly improves the vibration performance of the unit and allows for maximum use of COTS components as well as high density ball grid arrays (BGAs) in high vibration environments.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
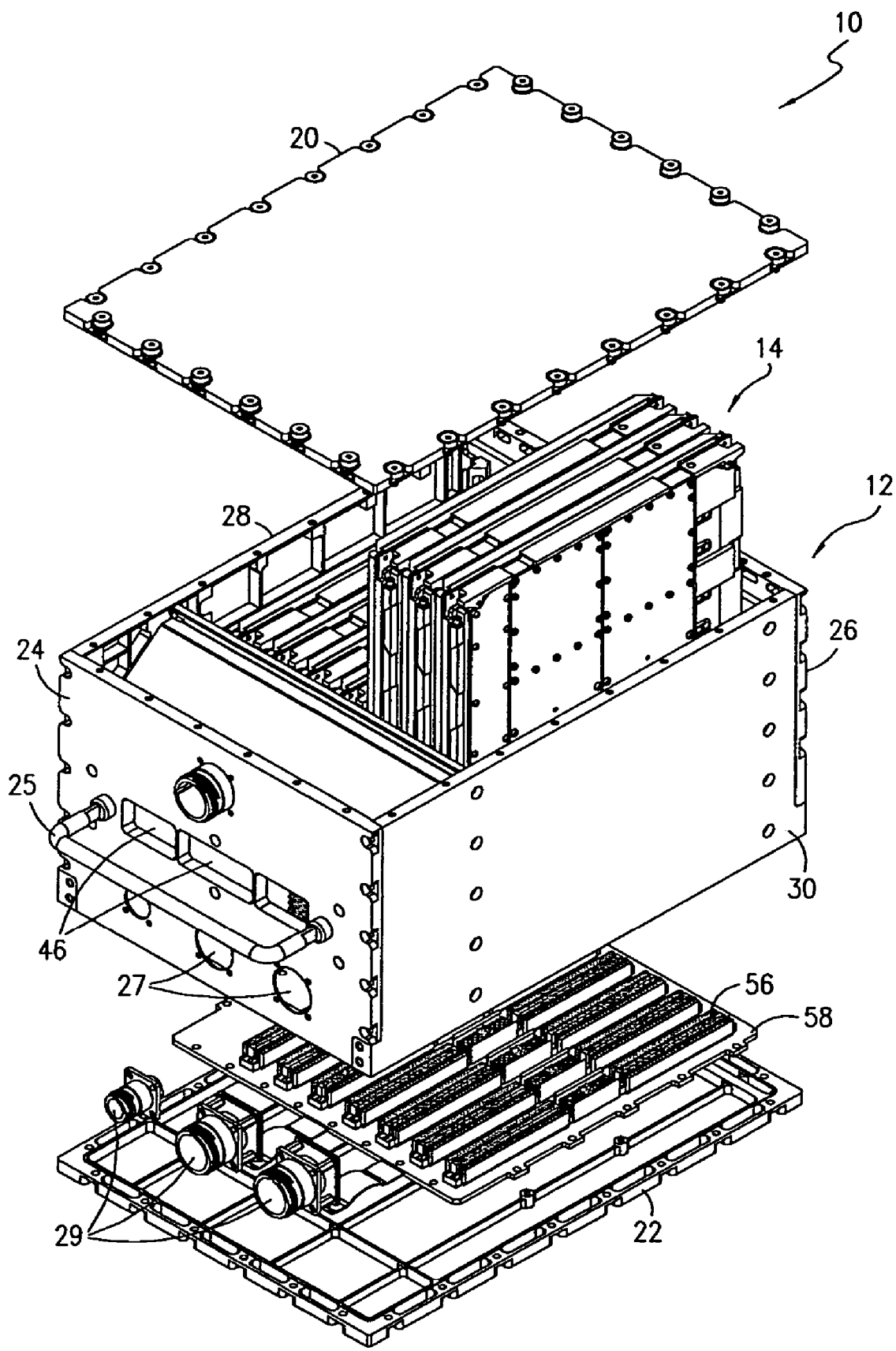
FIG. 1 is a partially disassembled, perspective view of the apparatus of this invention from top to bottom.

Referring now to the FIGS., the apparatus 10 of this invention includes a housing or chassis 12 having a hollow interior within which a number of modules 14 are mounted, each consisting of a straight-pass heat exchanger 16 directly connected to a circuit card assembly 18. The construction of the chassis 12 is described initially, followed by a discussion of the modules 14 and the connection between the two.

Figure 2:
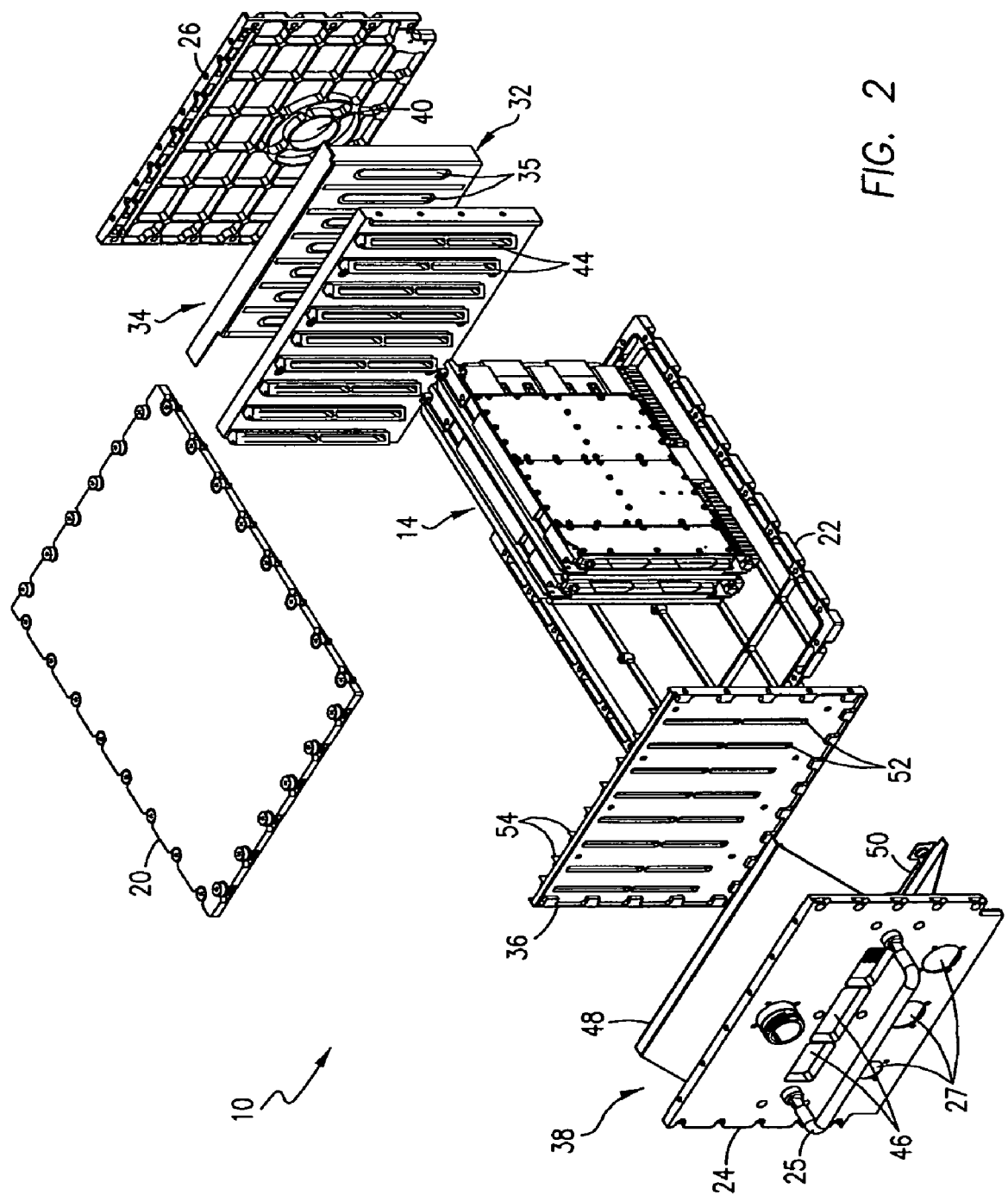
FIG. 2 is a partially disassembled, perspective view of the apparatus of FIG. 1 from end to end.

As best seen in FIGS. 1 and 2, the chassis 12 comprises a top wall 20, a bottom wall 22, a front wall 24, a back wall 26 and opposed side walls 28, 30 which are interconnected to form a hollow interior. The front wall 24 may be provided with a handle 25 and one or more apertures 27 to receive electrical connectors 29 as schematically depicted in the FIGS. An inlet end wall 32 is connected to the back wall 26 by an inlet plenum 34, and an outlet end wall 36 is mounted to an exhaust plenum 38 connected to the front wall 24. The back wall 26 is formed with an inlet port 40 which allows the passage of cooling air from outside of the chassis 12 into the inlet plenum 34. The inlet plenum 34 channels the outside air into a series of openings 42 in the inlet end wall 32. See also FIG. 4. In the presently preferred embodiment, the inlet plenum 34 is formed with a plurality of slots 35 each of which aligns with one of the openings 42 in the inlet end wall 32. These slots 35 can be of different size to allow more or less cooling air to pass in respective openings 42 dependent on the degree of cooling requirements of individual modules 14. Each of the openings 42 is connected to an inlet card guide 44, the detailed structure of which is described below. Similarly, the front wall 24 is formed with one or more exhaust ports 46 at the point of connection to the exhaust plenum 38. Preferably, the exhaust plenum 38 has an upper wall 48 and a lower wall 50 which taper inwardly, toward one another, from the location at which they connect to the outlet end wall 36 to the exhaust ports 46. As described in more detail below, cooling air passing through the heat exchanger 16 of each module 14 is directed through openings 52 in outlet card guides 54 formed on the outlet end wall 36 and then into the exhaust plenum 38 for discharge from the chassis 12 through the exhaust ports 46 in the front wall 24.

A number of modules 14 are mounted within the chassis 12 to the inlet and outlet card guides 44, 54, in a manner described in detail below. When positioned within the chassis 12, the circuit card assembly 18 of each module is plugged into a multi-pin connector 56 carried by a motherboard 58 mounted to the bottom surfaces of the inlet end wall 32, outlet end wall 36, and sidewalls 28 and 30 of chassis 12. The motherboard 58 and connectors 56 are preferably compatible with standard VME architectures, although it is contemplated that other standard or custom architectures could be accommodated, as desired.

Figure 5:
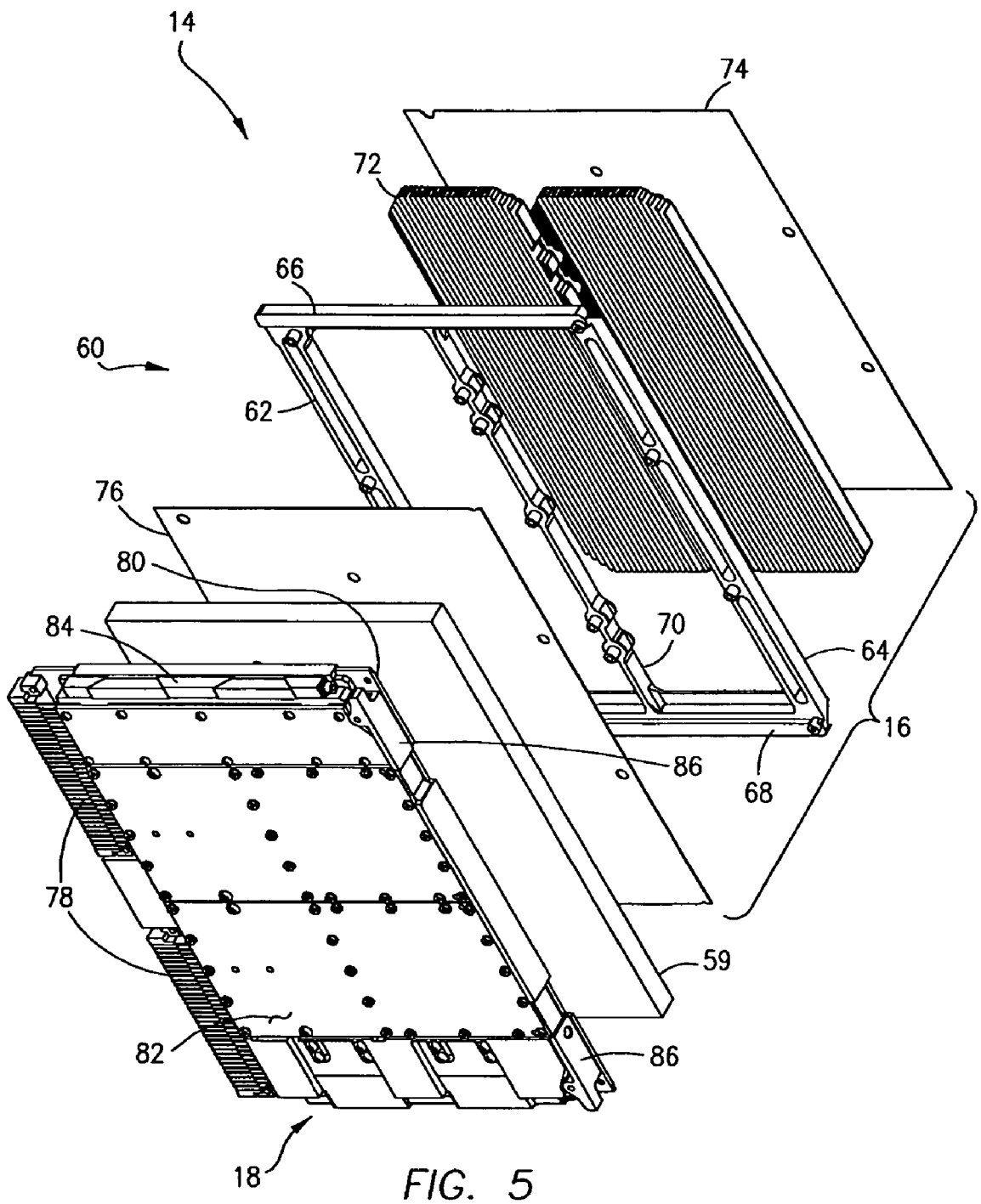
FIG. 5 is a disassembled, perspective view of a heat exchanger and circuit card assembly which form a module of this invention.

Referring now to FIG. 5, the detailed construction of modules 14 is shown. As noted above, each module 14 consists of a heat exchanger 16 and a circuit card assembly 18. A compliant thermal interface material 59 may be used to couple the heat exchanger 16 to the circuit card assembly 18 if the circuit card assembly 18 contains electrical components on its secondary side. If no electrical parts are present on the secondary side, the circuit card assembly may be bonded directly to the heat exchanger to minimize the thermal path. The heat exchanger 16 includes a frame 60 having side walls 62, 64 connected to end walls 66, 68, with a center support 70 extending between the end walls 66, 68. The frame 60 forms a seat within which a section of corrugated fin stock 72, preferably made of aluminum, is received and mounted between an outer skin 74 and a thermal interface sheet 76. The corrugations of the fin stock 72 are oriented in a direction between the end walls 66 and 68 of the frame, which corresponds to the direction of air flow between the inlet and outlet ends of the chassis 12. The heat exchanger 16 is characterized as a "straight-pass" unit because air flows from one end, along the corrugated fin stock 72 to the opposite end, in an essentially straight flow path.

The circuit card assembly 18 is of standard construction, the details of which form no part of this invention except as noted below. The assembly 18 has multi-pin connectors 78 at one end which plug into the multi-pin connectors 56 on the motherboard 58. The circuit card assembly 18 may support the addition of PMC circuit card assemblies 82 attached to a heat sink often mounted to the primary side of the printed wiring board 80 as shown in FIG. 5. A standard wedge lock 84 is mounted to opposite ends of the circuit card assembly 18, for purposes to become apparent below. Further, each end of the circuit card assembly 18 mounts an ejector 86 which is pivotal to allow the assembly 18 to be dislodged from the motherboard 58 and removed from the chassis 12, as desired.

Figure 3:
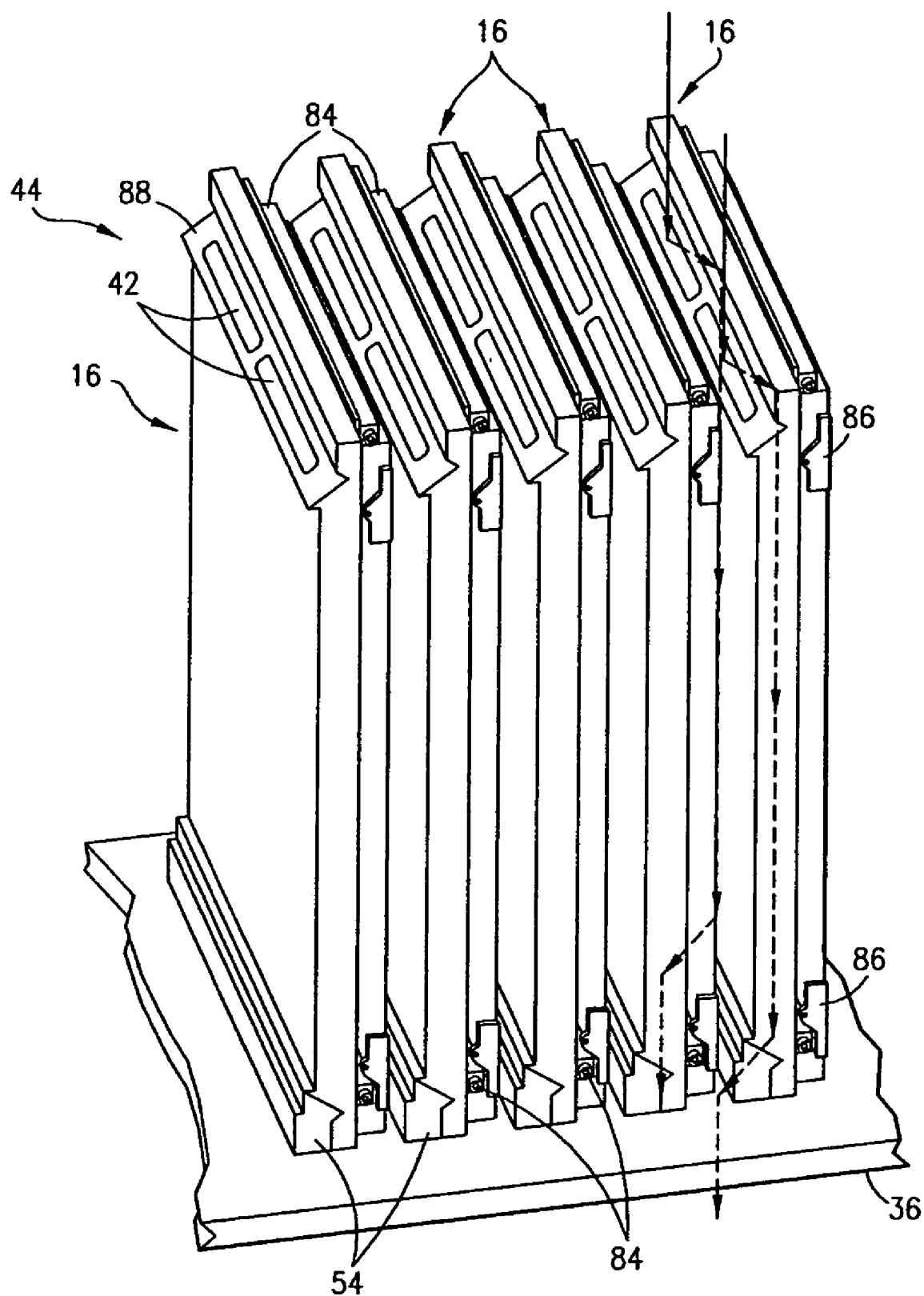
FIG. 3 is a partial perspective view of several modules mounted side-by-side to one end of the chassis of the apparatus of FIG. 1, with the side walls and opposite end of the chassis removed for ease of illustration.
Figure 4:
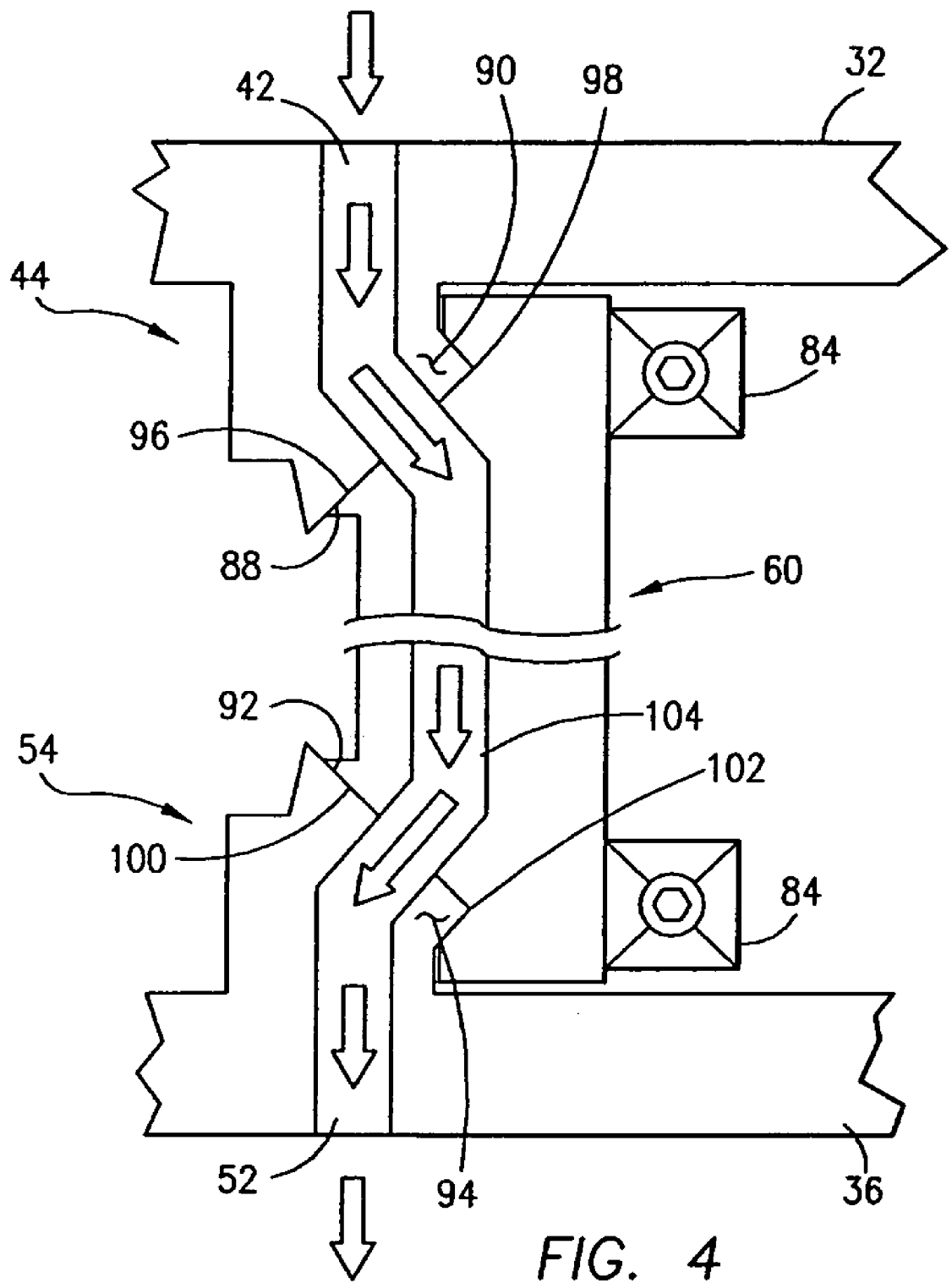
FIG. 4 is an enlarged, segmented, cross sectional view between a module and inlet and outlet card guide.

With reference now to FIGS. 3 and 4, details of the manner of mounting each of the modules 14 to the chassis 12 are shown. In the presently preferred embodiment, each of the inlet card guides 44 is machined in and protrudes outwardly from the inlet end wall 32, extending substantially along the height dimension of the inlet end wall 32, so that each opening 42 in the inlet end wall 32 is integral with one of the inlet card guides 44. The term "height dimension" is intended to refer to the top to bottom dimension in the orientation depicted in the FIGS. The outwardly facing surface of each heat exchanger inlet 44 is an angled surface 88 extending at an acute angle of about 45° with respect to the inlet end wall 32. An angled support edge 90 forms part of the inlet card guide 44. Similarly, each of the outlet card guides 54 is integrally formed in the outlet end wall 36, such as by machining, and extends to a height coextensive with that of the inlet card guides 44. Each opening 52 formed in the outlet end wall 36 is integral with one of the outlet card guides 54, and terminates at an angled surface 92 formed in the outlet card guide 54. The angled surface 92 of each outlet card guide 54 preferably extends at the same acute angle as the tapered surface 88 of the inlet card guides 44. An angled support edge 94 forms part of each outlet card guide 54.

Opposite ends of the heat exchanger 16 portion of each module 14 are formed to mate and interlock with respective inlet and outlet card guides 44 and 54. In the presently preferred embodiment, the frame 60 of heat exchanger 16 has one end formed with an angled surface 96 which mates with the angled surface 88 of the inlet card guide 44, and a V-groove recess 98 which receives the support edge 90 of the inlet card guide. The opposite end of the heat exchanger frame 60 has similar structure. It includes an angled surface 100 which mates with the angled surface 92 of an outlet card guide 54, and a V-groove recess 102 which receives the support edge 94 of the outlet card guide 54.

Each module 14 is mounted within the chassis 12 as follows. As shown in FIG. 1, the top wall 20 of chassis 12 is removed to provide access to the hollow interior. Each module 14 is oriented so that its multi-point connectors 78 face toward the bottom wall 22, and the support edges 90, 94 of the inlet and outlet card guides 44, 54 are received within the respective V-groove recesses 98 and 102 of the heat exchanger frame 60. The module 14 is then slid along the inlet and outlet card guides 44, 54 until its multi-pin connectors 78 engage and connect to the corresponding multi-pin connectors 56 of the motherboard 58. In the seated position of a module 14, the angled surfaces 96 and 100 at opposite ends of the heat exchanger frame 60 contact substantially the entire surface area of the angled surfaces 88 and 92 on the inlet and outlet card guides 44, 54, respectively. Each opening 42 in the inlet end wall 32 and one of the inlet card guides 44 aligns with a central passage 104 in the heat exchanger 16, which is the area where the fin stock 72 is located, and the openings 52 in the outlet end wall 36 and outlet card guides 54 also align with central passage 104.

This construction provides an essentially straight flow path from the inlet end wall 32, through the heat exchanger 16 and out of the outlet end wall 36 ensuring a highly efficient transfer of heat from the circuit card assembly 18 mounted thereto and minimal pressure drop in the course of passage of cooling air through such flow path. Cooling air from outside of the chassis 12 enters its interior through the inlet port 40 in back wall 26 and is distributed by the inlet plenum 34 to each of the openings 42. As noted above, a slot 35 is formed in the inlet plenum 34 for each opening 42, and, hence, for each module 14. It is contemplated that the size of such slots 35 can be varied depending on the circuit elements present on the circuit card assembly 18 of a particular module 14. That is, a circuit card assembly 18 which produces 120 watts, for example, would require more cooling air and therefore a larger-size slot 35 than a 20 watt circuit card assembly 18. The size of the slots 35 is therefore adjusted accordingly for a given group of modules 14. After passing through the heat exchanger 16 along the flow path noted above, the now heated air exits the chassis 12 though the exhaust plenum 38 and exhaust ports 46 in the front wall 24.

A series of modules 14 are placed side-by-side within the chassis 12 in the manner described above, and each is "locked" in place by operation of the wedge locks 84 located at either end of each module. An Allen wrench or the like is inserted into each wedge lock 84 and rotated causing the angled surfaces 88 and 92 of the heat exchanger frame 60 to bear against the angled surfaces 96 and 100, and against the support edges 90, 94, of the inlet card guide 44 and outlet card guide 54, respectively. This creates an airtight seal at each end of the heat exchanger 16 which does not require a gasket, and, hence, avoids maintenance issues which can arise with seals that wear over time. Further, substantial rigidity is provided at the connection between the ends of the heat exchanger frame 60 and the inlet and outlet card guides 44, 54 due to the relatively large, angled area of contact between their angled surfaces and the force generated by the wedge locks 84. This enhances the rotational stiffness at such interface and significantly improves the vibration performance of the chassis 12. The modules 14 may be removed from the chassis 12 by loosening the wedge locks 84 and operating the ejectors 86 at ends of the module 14.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof.

For example, wedge locks 84 are depicted in the drawings and described above as a means of locking or retaining the modules 14 in place within the chassis 12. It is contemplated that other locking or retainer devices could be employed to releasably secure the modules 14 such as spring clips, screws or other devices.

Therefore, it is intended that the invention not be limited to the particular embodiment disclosed as the best mode contemplated for carrying out this invention, but that the invention will include all embodiments falling within the scope of the appended claims.

What is claimed is:

1. Apparatus for mounting and cooling a plurality of circuit card assemblies each having electrical circuit elements, comprising:

a chassis having an inlet end wall, an outlet end wall spaced from said inlet end wall and opposed side walls extending between said inlet and outlet end walls which collectively define a hollow interior, said chassis being adapted to mount a motherboard having connectors which electrically connect to the circuit card assemblies;

said inlet end wall having a number of spaced inlet card guides and said outlet end wall having a number of spaced outlet card guides, said inlet end wall being formed with at least one air inlet opening communicating with said inlet card guides and said outlet end wall being formed with at least one air exhaust opening communicating with said outlet card guides; and a plurality of heat exchangers each having an inlet end, an outlet end and opposed sides, one of said opposed sides being adapted to be mounted in thermal communication with a circuit card assembly, said inlet end of each heat exchanger engaging one of said inlet card guides on said inlet end wall and said outlet end of each heat exchanger engaging one of said outlet card guides on said outlet end wall forming a flow path for cooling air between said inlet and outlet end walls.

2. The apparatus of claim 1 in which each of said inlet card guides is formed with an angled surface oriented at an angle with respect to said inlet end wall.

3. The apparatus of claim 2 in which said inlet end of each of said heat exchangers is formed with an angled surface which mates with said angled surface of said inlet card guides.

4. The apparatus of claim 1 in which each of said outlet card guides is formed with an angled surface oriented at an angle with respect to said outlet end wall.

5. The apparatus of claim 4 in which said outlet end of each of said heat exchangers is formed with an angled surface which mates with said angled surface of said outlet card guides.

6. The apparatus of claim 1 in which each of said heat exchangers comprises:
a frame having at least one cavity;
a center section of thermally conductive fin stock material mounted in said at least one cavity; and
a first thermally conductive panel mounted to one side of said center section, and a second thermally conductive panel mounted to the other side of said center section.

7. The apparatus of claim 6 in which one of said first and second thermally conductive panels of each heat exchanger is adapted to directly mount to a circuit card assembly.

8. The apparatus of claim 6 in which each of said heat exchangers is a straight-pass heat exchanger formed with an essentially straight air flow path between said inlet end and said outlet end thereof over said center section of thermally conductive fin stock material.

9. The apparatus of claim 1 in which each of said inlet card guides and said outlet card guides is formed with an angled surface and a support edge.

10. The apparatus of claim 9 in which a recess is formed in each of said heat exchangers adjacent said inlet end and said outlet end thereof, said support edge of each of said inlet card guides and said outlet card guides being received within one of said recesses.

11. The apparatus of claim 1 in which said chassis further includes a front wall having exhaust openings, and an exhaust plenum connected between said outlet end wall and said front wall.

12. The apparatus of claim 1 in which said chassis further includes a back wall having inlet openings, and an inlet plenum connected between said inlet end wall and said back wall.

13. The apparatus of claim 12 in which said inlet plenum is formed with a plurality of spaced slots, each of said slots aligning with one of said inlet card guides.

14. The apparatus of claim 13 in which said slots in said inlet plenum are formed of a selected size, the greater the size of said slots the more cooling air being permitted to flow therethrough.

15. The apparatus of claim 1 further including first and second retaining devices, each of said first retaining devices sealing said inlet end of one heat exchanger to one of said inlet card guides, and each of said second retaining devices sealing said outlet end of one heat exchanger to one of said outlet card guides.

16. The apparatus of claim 15 in which said first and second retaining devices are wedge lock devices.

17. Apparatus for mounting and cooling electrical circuit elements, comprising:
a chassis having an inlet end wall, an outlet end wall spaced from said inlet end wall, opposed side walls extending between said inlet and outlet end walls and a bottom wall which collectively define a hollow interior, said bottom wall being adapted to mount a motherboard;

said inlet end wall having a plurality of spaced inlet card guides and said outlet end wall having a plurality of spaced outlet card guides, said inlet end wall being formed with at least one air inlet opening communicating with said inlet card guides and said outlet end wall being formed with at least one air exhaust opening communicating with said outlet card guides;

a plurality of modules each including a heat exchanger mounted to a circuit card assembly carrying electrical circuit elements, said heat exchanger of each module having an inlet end which engages one of said inlet card guides on said inlet end wall and an outlet end which engages one of said outlet card guides on said outlet end wall, a substantially straight air flow path being provided through said heat exchanger of each module and respective air inlet openings and air exhaust openings formed in each of said inlet and outlet card guides; and a plurality of first and second retaining devices, each of said first retaining devices sealing said inlet end of said heat exchanger of each module to one of said inlet card guides, and each of said second retaining devices sealing said outlet end of said heat exchanger of each module to one of said outlet card guides.

18. The apparatus of claim 17 in which each of said inlet card guides is formed with an angled surface oriented at an angle with respect to said inlet end wall.

19. The apparatus of claim 18 in which said inlet end of said heat exchanger of each module is formed with an angled surface which mates with said angled surface of one of said inlet card guides.

20. The apparatus of claim 17 in which each of said outlet card guides is formed with an angled surface oriented at an angle with respect to said outlet end wall.

21. The apparatus of claim 20 in which said outlet end of said heat exchanger of each module is formed with an angled surface which mates with said angled surface of one of said outlet card guides.

22. The apparatus of claim 17 in which said heat exchanger of each of said modules is a straight-pass heat exchanger, including:
a frame having at least one cavity;
a center section of thermally conductive fin stock material mounted in said at least one cavity;

a first thermally conductive panel mounted on one side of said center section, and a second thermally conductive panel mounted to the other side of said center section; and a thermal interface material mounted to one of said first and second thermally conductive panels, said thermal interface material being adapted to connect to a circuit card assembly.

23. The apparatus of claim 17 in which said first and second retaining devices are wedge lock devices.

24. The apparatus of claim 17 in which said inlet plenum is formed with a plurality of spaced slots, each of said slots aligning with one of said inlet card guides.

25. The apparatus of claim 24 in which said slots in said inlet plenum are formed of a selected size, the greater the size of said slots the more cooling air being permitted to flow therethrough.

* * * * *